(12) United States Patent
Jin et al.

(10) Patent No.: US 10,929,300 B2
(45) Date of Patent: Feb. 23, 2021

(54) SEMICONDUCTOR MEMORY DEVICE FOR CONTROLLING AN ADDRESS FOR TEMPERATURE MANAGEMENT

(71) Applicant: SK hynix Inc., Icheon-si (KR)

(72) Inventors: Youngjae Jin, Seoul (KR); Youngsuk Moon, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 10 days.

(21) Appl. No.: 16/362,234

(22) Filed: Mar. 22, 2019

(65) Prior Publication Data
US 2019/0310946 A1   Oct. 10, 2019

(30) Foreign Application Priority Data
Apr. 10, 2018   (KR) .................... 10-2018-0041449

(51) Int. Cl.
*G06F 12/1027* (2016.01)
*G06F 12/10* (2016.01)
(Continued)

(52) U.S. Cl.
CPC ............ *G06F 12/10* (2013.01); *G06F 3/0604* (2013.01); *G06F 3/0659* (2013.01); *G06F 3/0673* (2013.01); *G11C 8/10* (2013.01); *G06F 12/1027* (2013.01); *G06F 2212/1008* (2013.01); *H03K 19/21* (2013.01)

(58) Field of Classification Search
None
See application file for complete search history.

(56) References Cited

U.S. PATENT DOCUMENTS 9,195,577 B2   11/2015   Saraswat et al.
9,218,285 B2   12/2015   Udipi et al.
(Continued)

FOREIGN PATENT DOCUMENTS

KR   1020140006299 A   1/2014
KR      101596652 B1   2/2016

OTHER PUBLICATIONS

Allyn Malventano, Breaking: Intel and Micron announce 3D XPoint Technology—1000x Faster Than NAND, Jul. 28, 2015, pp. 1-18, PC Perspective, https://www.pcper.com/news/Storage/Breaking-Intel-and-Micron-announce-3D-XPoint-Technology-1000x-Faster-NAND.

(Continued)

*Primary Examiner* — Brian R Peugh
(74) *Attorney, Agent, or Firm* — William Park & Associates Ltd.

(57) ABSTRACT

A semiconductor memory device includes a cell circuit including a plurality of cell dies arranged in a cell die stack. The semiconductor device also includes a control circuit configured to control the cell circuit, wherein the control circuit includes an address decoder and an address conversion circuit. The address decoder is configured to decode an address signal provided by a host and to output address information including a first address which identifies a first cell die, of the plurality of cell dies, requested by the host. The address conversion circuit is configured to convert the first address to a second address using the address information and to provide the second address to the cell circuit, wherein the second address is used to identify a second cell die of the plurality of cell dies different from the first cell die.

11 Claims, 3 Drawing Sheets

(51) Int. Cl.
*G11C 8/10* (2006.01)
*G06F 3/06* (2006.01)
*H03K 19/21* (2006.01)

(56) References Cited

U.S. PATENT DOCUMENTS

| | | | |
|---|---|---|---|
| 9,342,443 B2 | 5/2016 | Walker et al. | |
| 9,747,058 B2 * | 8/2017 | Oh | G06F 3/0619 |
| 2008/0181048 A1 * | 7/2008 | Han | G11C 16/349 |
| | | | 365/236 |
| 2008/0285346 A1 * | 11/2008 | Han | G11C 8/10 |
| | | | 365/185.05 |
| 2013/0031347 A1 * | 1/2013 | Jones | G06F 12/0638 |
| | | | 713/2 |
| 2014/0241099 A1 * | 8/2014 | Seo | G11C 8/12 |
| | | | 365/230.04 |

OTHER PUBLICATIONS

Joonyoung Kim et al., HBM: Memory Solution for Bandwidth-Hungry Processors, Aug. 2014, pp. 1-24, SK hynix Inc., Republic of Korea.
Ron Maltiel, Toshiba Next NAND—3D with 15 Layers, pp. 1-2, Ron Maltiel Semiconductor Consulting, http://www.maltiel-consulting.com/toshiba-next-nand-3d-with-15-layers.html.

* cited by examiner

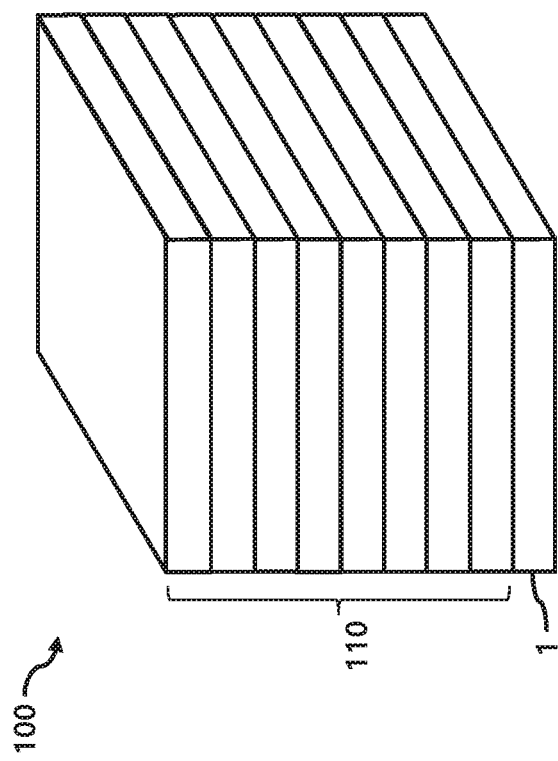

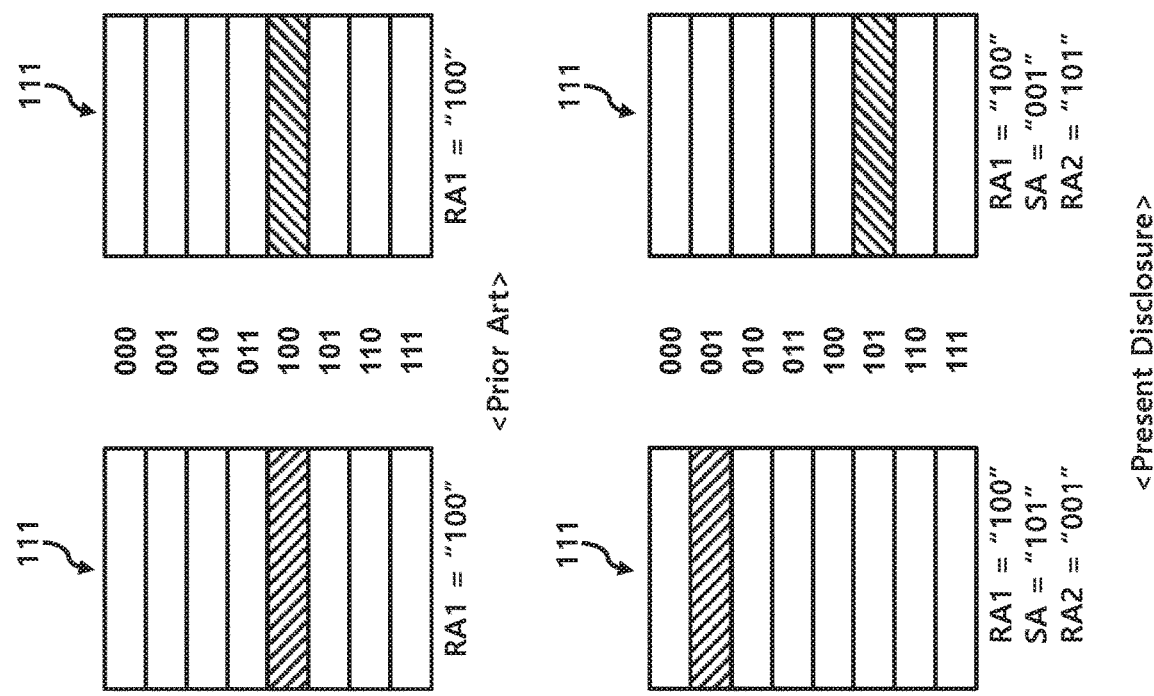

SEMICONDUCTOR MEMORY DEVICE FOR CONTROLLING AN ADDRESS FOR TEMPERATURE MANAGEMENT

CROSS-REFERENCE TO RELATED APPLICATIONS

The present application claims priority under 35 U.S.C. § 119(a) to Korean Patent Application No. 10-2018-0041449, filed on Apr. 10, 2018, which is incorporated herein by reference in its entirety.

BACKGROUND

1. Technical Field

Various embodiments generally relate to a semiconductor memory device for controlling an address in order to manage temperature rise due to concentrated access to a cell die.

2. Related Art

For a semiconductor memory device in which a plurality of cell dies are stacked, a temperature of a cell die may rise when the cell die receives concentrated accesses.

In such case, not only the cell die but also adjacent cell dies may experience deteriorating data storage characteristics and corruption of data due to high temperatures.

SUMMARY

In accordance with the present teachings, a semiconductor memory device includes a cell circuit including a plurality of cell dies arranged in a cell die stack. The semiconductor device also includes a control circuit configured to control the cell circuit, wherein the control circuit includes an address decoder and an address conversion circuit. The address decoder is configured to decode an address signal provided by a host and to output address information including a first address which identifies a first cell die, of the plurality of cell dies, requested by the host. The address conversion circuit is configured to convert the first address to a second address using the address information and to provide the second address to the cell circuit, wherein the second address is used to identify a second cell die of the plurality of cell dies different from the first cell die.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIG. 2 shows a diagram illustrating a stack structure of a semiconductor memory device, according to an embodiment of the present disclosure.

FIG. 3 shows a diagram illustrating an operation of an address conversion circuit of a semiconductor memory device, according to an embodiment of the present disclosure.

DETAILED DESCRIPTION

Figure 1:
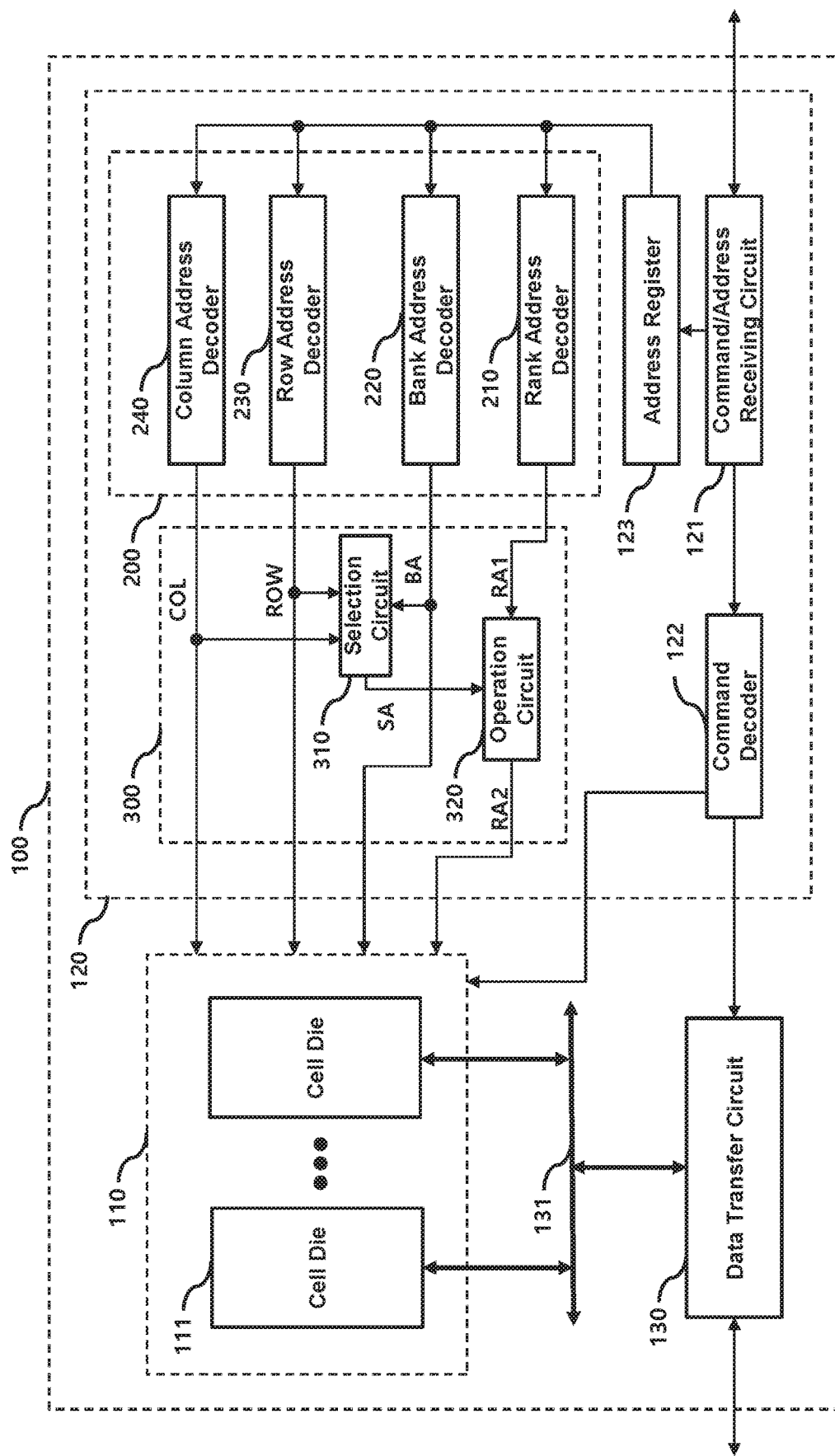
FIG. 1 shows a block diagram illustrating a semiconductor memory device, according to an embodiment of the present disclosure.

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

FIG. 1 shows a block diagram illustrating a semiconductor memory device 100, according to an embodiment of the present disclosure.

As pictured, the semiconductor memory device 100 includes a cell circuit 110, a control circuit 120, and a data transfer circuit 130.

The data transfer circuit 130 transmits and receives data to and from an external device, such as a host.

The cell circuit 110 and the data transfer circuit 130 transmit and receive data via a bus circuit 131.

Because the data transfer circuit 130 and the bus circuit 131 are well-known structures in the art, a detailed description thereof is omitted.

The cell circuit 110 includes a plurality of cell dies 111, which are stacked.

The control circuit 120 and the data transfer circuit 130 may be included in a logic die 1 and may be stacked together with the cell circuit 110, as shown in FIG. 2.

In the present description, it is assumed that the semiconductor memory device 100 is a Dynamic Random Access Memory (DRAM) device, but the present teachings are not limited to DRAM devices.

Although it is assumed in the present description that each cell die 111 is identified using a rank address, the address identifying the cell die 111 may vary according to embodiment.

The control circuit 120 processes the addresses and commands provided by a host to control the cell circuit 110 and the data transfer circuit 130.

The control circuit 120 includes a command/address receiving circuit 121 for receiving a command signal and an address signal provided by the host, a command decoder 122 for decoding the command signal and for controlling the cell circuit 110 and the data transfer circuit 130, and an address register 123 for storing the address signal.

The control circuit 120 includes an address decoder 200, which decodes the address signal.

As illustrated, the address decoder 200 includes a rank address decoder 210, a bank address decoder 220, a row address decoder 230, and a column address decoder 240.

The rank address decoder 210 decodes the address signal output from the address register 123 and outputs a first address RA1. The first address RA1 may be referred to as a first rank address, which corresponds to a rank address used for identifying a cell die.

The bank address decoder 220 decodes the address signal output from the address register 123 and outputs a bank address BA.

The row address decoder 230 decodes the address signal output from the address register 123 and outputs a row address ROW.

The column address decoder 240 decodes the address signal output from the address register 123 and outputs a column address COL.

The type of address used in the semiconductor memory device 100 can be different for different embodiments, thus the configuration of the address decoder 200 will be different for different embodiments.

For the present description, the rank address is an address for identifying a cell die 111, and the bank address, the row address, and the column address are addresses for identifying banks, rows, and columns of the cell die 111, respectively.

In an embodiment, the address signal includes 35 bits in total, the rank address includes 3 bits, the bank address includes 3 bits, the row address includes 14 bits, and the column address includes 11 bits. The address signal may further include 1 channel address bit and 3 padding bits.

The control circuit 120 further includes an address conversion circuit 300.

The address conversion circuit 300 generates a second address RA2 using signals output from the address decoder 200.

The second address RA2 may also be referred to as a second rank address, which corresponds to a rank address used for identifying a cell die.

The second address RA2 increases randomness in accessing the cell dies 111 as compared to identifying a cell die 111 using the first address RA1.

Increasing the randomness in accessing the cell dies 111 alleviates the phenomenon by which read or write requests from a host are concentrated on the same cell die 111. This, in turn, reduces the temperature rise of the cell die 111.

As illustrated, the address conversion circuit 300 includes a selection circuit 310 and an operation circuit 320.

For the present description, the selection circuit 310 outputs selection data SA from address information including the bank address BA, the row address ROW, and/or the column address COL.

The method of outputting the selection data SA from the selection circuit 310 may be different for different embodiments.

The selection circuit 310 may select one of the bank address BA, the row address ROW, and the column address COL. In another embodiment, the selection circuit 310 may generate the selection data SA from at least one of the bank address BA, the row address ROW, and the column address COL. For example, the selection circuit 310 may execute an algorithm to generate the selection data SA.

In the present description, 3 bits out of 14 bits are selected when selecting the row address ROW and 3 bits out of 11 bits are selected when selecting the column address COL.

Which address is to be selected in the selection circuit 310 can be set in a mode register of the semiconductor memory device 100 or the like.

Hereinafter, it is assumed that the selection circuit 310 is configured to select the bank address BA and output the bank address BA as the selection data SA.

The operation circuit 320 generates the second address RA2 by performing a logic operation on the first address RA1 and the selection data SA.

For an embodiment, the second address RA2 is generated by performing a bitwise Exclusive OR (XOR) gate logic operation on the first address RA1 and the selection data SA.

FIG. 3 shows a diagram illustrating an operation of the address conversion circuit 300.

The upper part of FIG. 3 shows a case where a cell die of the stacked cells dies 111 is identified and accessed with the first address RA1, in accordance with the prior art.

If the first address RA1 obtained by decoding the currently requested address is "100" and the first address RA1 obtained by decoding the next requested address is "100," the same cell die is accessed consecutively, as indicated by the same shaded cell die in the upper part of FIG. 3. When the same cell die is repeatedly accessed, heat can build in the cell die and degrade its performance. Similarly, when neighboring cell dies are consecutively accessed, the later-accessed cell die might be preheated by the previously accessed adjacent cell die. Heat can also be slow to dissipate when it builds up in internal regions of a cell die stack.

The lower part of FIG. 3 shows a case where a cell die of the cell dies 111 is identified and accessed with the second address RA2, in accordance with the present teachings.

The second address RA2 is converted to "001" when the first address RA1 is "100" and the bank address BA provided as the selection data SA is "101."

The second address RA2 is converted to "101" when the first address RA1 is "100" and the bank address BA provided as the selection data SA is "001."

In this way, when an access is determined by the second address RA2, different cell dies may be accessed with a same first address RA1, as indicated by different shaded cell dies in the lower part of FIG. 3.

The example of FIG. 3 shows that even when a host requests reading or writing to the same rank, the request can be processed at a different cell dies when the bank address BA changes. Similarly, when a host requests reading or writing to neighboring cell dies, the request can be processed so that the neither the same cell die nor neighboring cell dies are consecutively accessed.

As a result, the issue of rising temperature in a cell die due to concentrated accesses to the same cell die or neighboring can be mitigated or averted.

The present teachings do not require an additional element to sense temperature for managing the temperature of a cell die.

As described above, the present disclosure can efficiently manage heat generated in a cell die while simplifying the configuration of a semiconductor memory device.

For an embodiment, the present teachings work by internally converting an address identifying a cell die. Therefore, there is no need to change the configuration and operation of other elements, such as the data transfer circuit 130 and the command decoder 122.

Because the thermal management is performed without substantially affecting data I/O operations, the data I/O performance is not lowered as compared with a conventional semiconductor memory device.

In addition, because a semiconductor memory device according to the present disclosure does not require a change of configuration or operation of an external device, such as a host, it is possible to perform the thermal management while using the existing system as it is.

Although various embodiments have been described for illustrative purposes, it will be apparent to those skilled in the art that various changes and modifications may be made to the described embodiments without departing from the spirit and scope of the disclosure as defined by the following claims.

What is claimed is:
1. A semiconductor memory device comprising:
a cell circuit including a plurality of cell dies arranged in a cell die stack; and
a control circuit configured to control the cell circuit, wherein the control circuit comprises:
an address decoder configured to decode an address signal provided by a host and to output address information including a first address which identifies a first cell die, of the plurality of cell dies, requested by the host; and an address conversion circuit configured to convert the first address to a second address using the address information and to provide the second address to the cell circuit, wherein the second address is used to identify a second cell die of the plurality of cell dies different from the first cell die, wherein the control circuit further comprises:

a command/address receiving circuit configured to receive a command signal and the address signal provided by the host;

an address register configured to store the address signal; and a command decoder configured to decode the command signal.

2. The semiconductor memory device of claim 1, further comprising:

a data transfer circuit configured to transmit data to and receive data from the host; and a bus circuit configured to pass data between the data transfer circuit and the cell circuit.

3. The semiconductor memory device of claim 1, further comprising a logic die stacked with the plurality of cell dies, wherein the logic die includes the control circuit.

4. A semiconductor memory device of claim 1 comprising:

a cell circuit including a plurality of cell dies arranged in a cell die stack; and a control circuit configured to control the cell circuit, wherein the control circuit comprises:

an address decoder configured to decode an address signal provided by a host and to output address information including a first address which identifies a first cell die, of the plurality of cell dies, requested by the host; and an address conversion circuit configured to convert the first address to a second address using the address information and to provide the second address to the cell circuit, wherein the second address is used to identify a second cell die of the plurality of cell dies different from the first cell die, wherein the address decoder is further configured to decode a previous address signal provided by the host and to output previous address information including a previous first address which identifies a previous first cell die, of the plurality of cell dies, requested by the host, wherein the address conversion circuit is further configured to convert the previous first address to a previous second address using the previous address information and to provide the previous second address to the cell circuit, wherein the previous second address is used to identify a previous second cell die of the plurality of cell dies different from the previous first cell die, wherein the previous first cell die and the first cell die are the same cell die, and wherein the previous second cell die and the second cell die are different cell dies.

5. A semiconductor memory device of comprising:

a cell circuit including a plurality of cell dies arranged in a cell die stack; and a control circuit configured to control the cell circuit, wherein the control circuit comprises:

an address decoder configured to decode an address signal provided by a host and to output address information including a first address which identifies a first cell die, of the plurality of cell dies, requested by the host; and an address conversion circuit configured to convert the first address to a second address using the address information and to provide the second address to the cell circuit, wherein the second address is used to identify a second cell die of the plurality of cell dies different from the first cell die, wherein the address decoder is further configured to decode a previous address signal provided by the host and to output previous address information including a previous first address which identifies a previous first cell die, of the plurality of cell dies, requested by the host, wherein the address conversion circuit is further configured to convert the previous first address to a previous second address using the previous address information and to provide the previous second address to the cell circuit, wherein the previous second address is used to identify a previous second cell die of the plurality of cell dies different from the previous first cell die, wherein the previous first cell die and the first cell die are the same cell die or neighboring cell dies in the cell die stack, and wherein at least one cell die of the cell die stack is between the previous second cell die and the second cell die.

6. A semiconductor memory device comprising:

a cell circuit including a plurality of cell dies arranged in a cell die stack; and a control circuit configured to control the cell circuit, wherein the control circuit comprises:

an address decoder configured to decode an address signal provided by a host and to output address information including a first address which identifies a first cell die, of the plurality of cell dies, requested by the host; and an address conversion circuit configured to convert the first address to a second address using the address information and to provide the second address to the cell circuit, wherein the second address is used to identify a second cell die of the plurality of cell dies different from the first cell die, wherein the address conversion circuit comprises:

a selection circuit configured to select a part of the address information excluding the first address and to output the part as selection data; and an operation circuit configured to generate the second address by performing a gate logic operation on the selection data and the first address.

7. The semiconductor memory device of claim 6, wherein the operation circuit performs a bitwise Exclusive OR (XOR) gate logic operation on the selection data and the first address to generate the second address.

8. The semiconductor memory device of claim 6, wherein the address information includes a rank address and the first address corresponds to the rank address.

9. The semiconductor memory device of claim 8, wherein the address information further includes a bank address, a row address, and a column address, and wherein the selection data is selected from at least one of the bank address, the row address and, the column address.

10. The semiconductor memory device of claim 9, wherein the address decoder comprises:

a rank address decoder configured to generate the first address by decoding the address signal;

a bank address decoder configured to generate the bank address by decoding the address signal;

a row address decoder configured to generate the row address by decoding the address signal; and a column address decoder configured to generate the column address by decoding the address signal.

11. The semiconductor memory device of claim 6, wherein the part selected by the selection circuit is set in a mode select register of the semiconductor memory device.

* * * * *

UNITED STATES PATENT AND TRADEMARK OFFICE
CERTIFICATE OF CORRECTION

PATENT NO. : 10,929,300 B2
APPLICATION NO. : 16/362234
DATED : February 23, 2021
INVENTOR(S) : Youngjae Jin et al.

Page 1 of 1

It is certified that error appears in the above-identified patent and that said Letters Patent is hereby corrected as shown below:

In the Claims

Column 5 Lines 26-58 should read:
4. A semiconductor memory device comprising:
a cell circuit including a plurality of cell dies arranged in a cell die stack; and
a control circuit configured to control the cell circuit, wherein the control circuit comprises:
an address decoder configured to decode an address signal provided by a host and to output address information including a first address which identifies a first cell die, of the plurality of cell dies, requested by the host; and
an address conversion circuit configured to convert the first address to a second address using the address information and to provide the second address to the cell circuit, wherein the second address is used to identify a second cell die of the plurality of cell dies different from the first cell die,
wherein the address decoder is further configured to decode a previous address signal provided by the host and to output previous address information including a previous first address which identifies a previous first cell die, of the plurality of cell dies, requested by the host,
wherein the address conversion circuit is further configured to convert the previous first address to a previous second address using the previous address information and to provide the previous second address to the cell circuit, wherein the previous second address is used to identify a previous second cell die of the plurality of cell dies different from the previous first cell die,
wherein the previous first cell die and the first cell die are the same cell die, and
wherein the previous second cell die and the second cell die are different cell dies.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*